(12) United States Patent
Lang et al.

(10) Patent No.: US 7,706,143 B2
(45) Date of Patent: Apr. 27, 2010

(54) MOUNTING PLATE FOR ELECTRONIC COMPONENTS

(75) Inventors: Martin Lang, Driedorf (DE); Wolfgang Reuter, Burbach (DE); Horst Besserer, Herborn (DE)

(73) Assignee: Rittal GmbH & Co. KG, Herborn (DE)

( * ) Notice: Subject to any disclaimer, the term of this patent is extended or adjusted under 35 U.S.C. 154(b) by 385 days.

(21) Appl. No.: 10/586,425

(22) PCT Filed: Apr. 8, 2005

(86) PCT No.: PCT/EP2005/003693

§ 371 (c)(1),
(2), (4) Date: Jul. 19, 2006

(87) PCT Pub. No.: WO2005/101938

PCT Pub. Date: Oct. 27, 2005

(65) Prior Publication Data

US 2008/0218966 A1    Sep. 11, 2008

(30) Foreign Application Priority Data

Apr. 19, 2004    (DE)    ........................ 10 2004 019 382

(51) Int. Cl.
*H05K 7/20*    (2006.01)
(52) U.S. Cl. ........................ 361/702; 361/688
(58) Field of Classification Search .................. 361/688, 361/702
See application file for complete search history.

(56) References Cited

U.S. PATENT DOCUMENTS

| | | | | |
|---|---|---|---|---|
| 1,504,478 A | * | 8/1924 | Hyser | 361/651 |
| 4,008,672 A | * | 2/1977 | Cianciotti | 112/470.07 |
| 4,100,395 A | * | 7/1978 | Ballard | 392/434 |
| 4,884,168 A | * | 11/1989 | August et al. | 361/702 |
| 5,263,538 A | | 11/1993 | Amidieu et al. | |
| 5,546,274 A | | 8/1996 | Davidson | |
| 6,462,949 B1 | * | 10/2002 | Parish et al. | 361/689 |
| 6,687,126 B2 | * | 2/2004 | Patel et al. | 361/688 |
| 6,992,887 B2 | * | 1/2006 | Jairazbhoy et al. | 361/688 |
| 7,191,998 B1 | * | 3/2007 | Chalberg et al. | 248/676 |

FOREIGN PATENT DOCUMENTS

DE    88 17 810.0    1/1983

(Continued)

OTHER PUBLICATIONS

Fischer elektronik specification sheet (3 pages): http://www.fischerelektronik.de.

*Primary Examiner*—Jayprakash N Gandhi
*Assistant Examiner*—Adrian S Wilson
(74) *Attorney, Agent, or Firm*—Pauley Peterson & Erickson

(57) ABSTRACT

A mounting plate for electronic components, including cooling conduits that are integrated into a plate body and that are traversed by a coolant, a fixing device for mounting electronic components that are to be cooled being located on the plate body. The mounting plate has the fixing device including at least one first groove with an approximately C-shaped cross-section, which extends in a linear manner in the extension direction of the mounting plate. At least one screw nut is inserted and locked against torsion in the groove in order to form a screw connection with an electronic component.

8 Claims, 3 Drawing Sheets

FOREIGN PATENT DOCUMENTS

| | | |
|---|---|---|
| DE | 33 15 414 A1 | 10/1984 |
| DE | 24 10 903 C2 | 2/1986 |
| DE | 36 33 625 A1 | 6/1987 |
| DE | 252 474 A1 | 12/1987 |
| DE | 93 18 474.3 | 4/1994 |
| DE | 43 31 377 A1 | 3/1995 |
| DE | 197 21 287 C1 | 7/1998 |
| DE | 298 05 944 U1 | 7/1998 |
| DE | 202 00 484 U1 | 7/2002 |
| EP | 0 654 176 B1 | 5/1995 |
| EP | 1 276 362 A2 | 1/2003 |
| JP | 08 046381 A | 2/1996 |

* cited by examiner

MOUNTING PLATE FOR ELECTRONIC COMPONENTS

BACKGROUND OF THE INVENTION

1. Field of the Invention

This invention relates to a mounting plate for electronic components, having coolant lines integrated in a plate body for cooling fluid to flow through, wherein a fastening arrangement for mounting electronic components to be cooled is arranged on the plate body.

2. Discussion of Related Art

It is known to install cooling coils in a mounting plate or a mounting board for cooling electronic devices, for example frequency converters, which are to be mounted on the mounting plate. The waste heat from the electronic components can be removed by a so-called "cold plate".

The electronic components can be held on a known mounting plate by screw connections. Screw holes are thus provided in the housings of the electronic components, through which a screw can be screwed into threaded holes to be cut into the mounting plate. However, holes cannot be cut into the known mounting plates without the danger of damage to the cooling coils. The electronic components often have varied dimensions, so that different fastening dimensions also exist. It is often not possible to provide the mounting plate with a prefabricated grid of threaded holes, because the threaded holes arranged on the housings of the electronic components are not aligned with the other threaded holes.

In known mounting plates of the PADA Engineering company, cooling coils are placed so they are visible from the plate surface in order to prevent accidental damage of the coolant conduits during the subsequent mechanical processing of the mounting plate.

However, it is necessary in connection with the known mounting plates to cut specially arranged threaded bores, depending on the fastening dimensions of the electronic components to be mounted. This is expensive from a manufacturing technology standpoint.

The packing density of several electronic components to be mounted is also reduced by the mounting areas prescribed by the position of the cooling coils, because not every location is suitable for drilling a threaded hole due to the layout of the coolant lines.

SUMMARY OF THE INVENTION

It is one object of this invention to provide a mounting plate for electronic components which, along with a reduced mounting cost outlay, assures the secure holding of electronic components to be mounted, and dependably prevents damage to the coolant lines. In addition, the mounting plate in accordance with this invention can make possible the greatest possible packing density of the electronic components.

This object of this invention is achieved with a fastening arrangement having the characteristics described in this specification and in the claims.

Accordingly, the fastening arrangement has at least one first groove embodied to be C-shaped in cross section and that extends in a straight line in the extension direction of the mounting plate, into which at least one screw nut for forming a screw connection with an electronic component can be inserted and fixed against relative rotation. The additional cutting of threaded holes is avoided by this arrangement. Mounting can be simply performed, wherein the matching to the structural conditions of the component housings is possible because of the arbitrarily possible positioning of the screw nut.

In accordance with one consideration, the fastening arrangement can have at least one second groove, which is designed identically to the first groove and which extends parallel with the first groove, whose distance from the first groove is substantially determined by a length of extension perpendicularly with respect to the first and second grooves of the electronic component to be mounted. It is thus assured that, with a preset fastening dimension of electronic components to be mounted, simple securing on the mounting plate can take place.

In accordance with one embodiment, the fastening arrangement can have a further groove, which is embodied identically to the first and the second grooves and that extends parallel with the second groove and which extends at the side of the second groove facing away from the electronic component to be mounted at a distance which is less than the distance between the first groove and the second groove. With this arrangement, an additional fastening dimension of electronic components to be mounted is taken into account.

Electronic components can be mounted in a simple manner, which have screw holes at distance from each other that corresponds to the distance of the second groove from the first groove, or to the still further groove from the second groove. In this way the electronic components can be directly fastened by screws in the screw nuts inserted into the grooves.

However, in case the fastening dimensions of the electronic components to be mounted do not agree with the distances between the parallel extending grooves, such as if the electronic components to be mounted have screw holes whose distance from each other is less than the distance of the second groove from the first groove, or less than the distance of the still further groove from the first groove, then the component can be fixed in place at least on one side by an angle bracket, wherein at least one screw engaging the angle bracket is screwed into the screw nut introduced into the respective groove.

Here, the angle bracket can have a level base plate for placement against the mounting plate and a clamping area angled off with respect to it for the clamping fixation of the electronic component to be mounted. In this case, the clamping area can clampingly act on a protrusion provided on the electronic component.

For achieving a particularly simple matching to different fastening dimensions of electronic components to be mounted, the angle bracket can have at least one elongated hole extending perpendicularly with respect to the extension direction of the second groove or of the still further groove for receiving the screw.

In one embodiment the screw nut can be a spring nut.

With regard to manufacturing technology, it can be advantageous if the first groove, the second groove and/or the still further groove are made of one piece with the plate body.

BRIEF DESCRIPTION OF THE DRAWINGS

This invention is explained in greater detail in view of a preferred embodiment, making reference to the drawings, wherein.

DETAILED DESCRIPTION OF THE INVENTION

Figure 1:
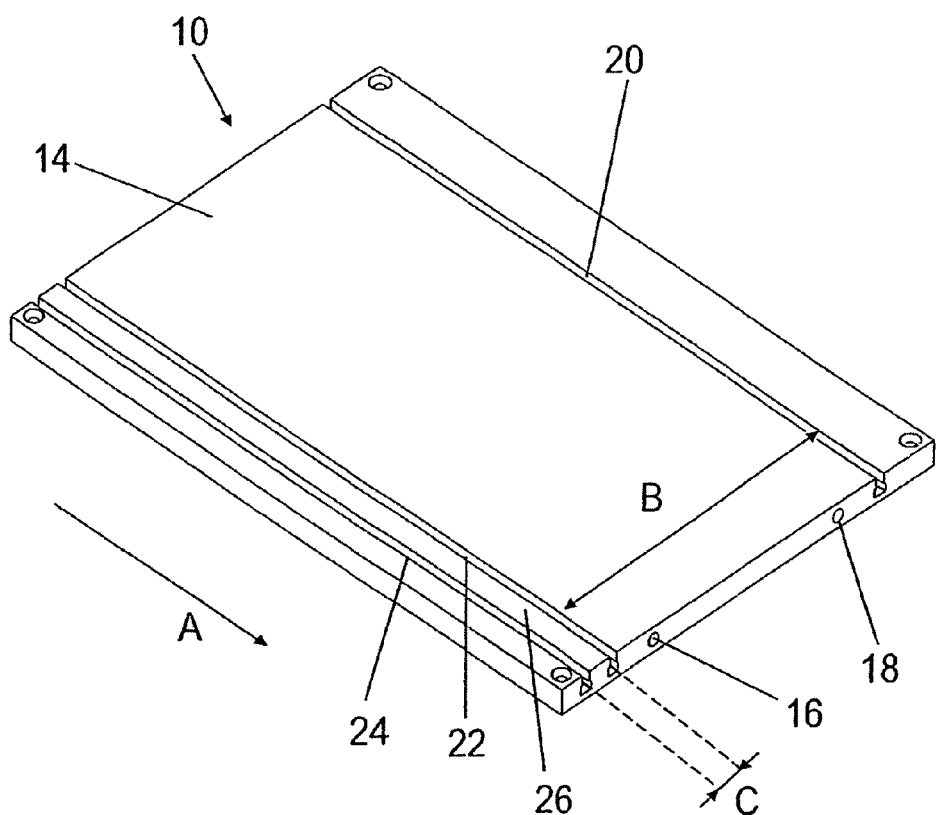
FIG. 1 shows in a schematic and perspective lateral view a mounting plate without electronic components to be mounted on it and to be cooled.

In a schematic and perspective lateral view, FIG. 1 shows a mounting plate 10 without electronic components to be mounted on it and to be cooled. The mounting plate 10 has a level plate body 14 made of aluminum, in which a coolant line with connectors 16 and 18 in the form of a cooling coil, not shown, is formed for coolant flow. In the area into which the coolant coil is integrally placed, the plate body 14 is not additionally machined and is shaped flat and level. On the right side in FIG. 1 of the area into which the coolant coil has been integrally placed, a first groove 20, which is embodied to be approximately C-shaped in cross section and extends straight in the extension direction (arrow A) of the mounting plate 10, is formed in one piece with the plate body. At least one spring nut (not shown) for forming a screw connection with an electronic component can be introduced, fixed against relative rotation, into the first groove 20. The electronic components to be attached can then be screwed together with the nut.

A second groove 22 extends parallel with the first groove 20 on the side of the plate body at the left in FIG. 1, into which the coolant coil is integrally placed. The distance B between the first groove 20 and the second groove is determined by the area of the plate body into which the coolant coil is integrally placed, and also by the extension length, running perpendicularly with respect to the first groove 20 and the second groove 22, of an electronic component.

A further groove 24 extends parallel with the first groove 20 and the second groove 22, which extends on the side 26 of the second groove facing away from the electronic component to be mounted at a distance C to the second groove 22. The distance C is less than the distance B between the first groove 20 and the second groove 22 and is matched to a different fastening dimension than that of the second groove 22.

Electronic components to be mounted, whose housing has screw holes with a distance that corresponds to the distance B of the second groove 22 from the first groove 20, or of the still further groove 24 from the first groove 20, can be directly fastened by screws in the screw nuts inserted into the grooves 20, 22, 24.

Figure 2:
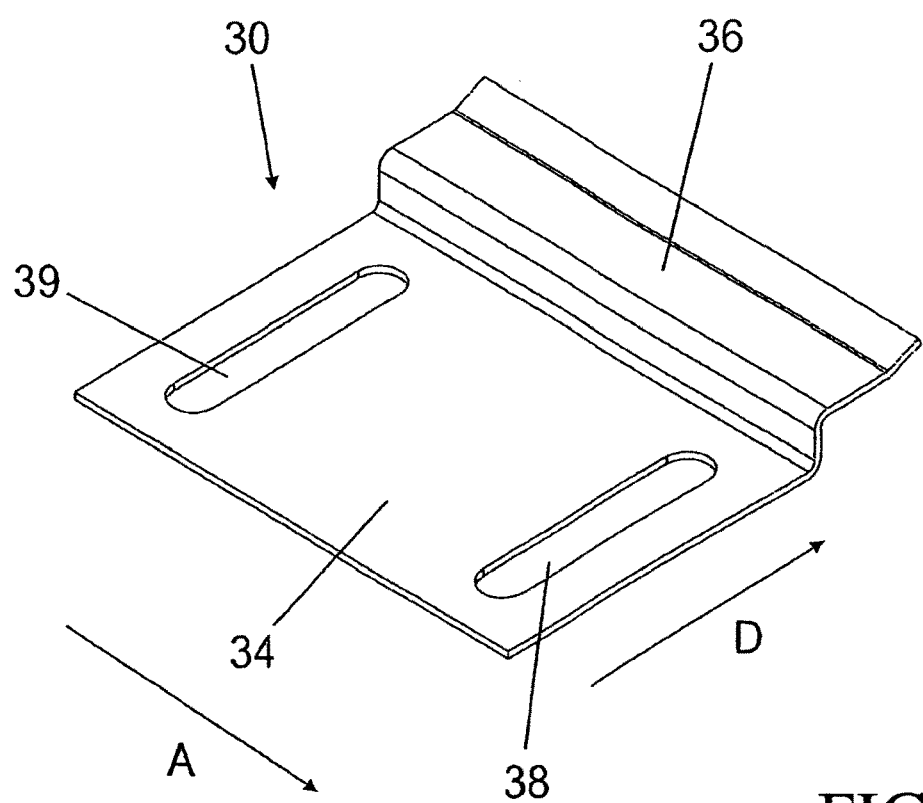
FIG. 2 shows in a schematic and perspective lateral view an angle bracket for mounting, which can be matched to various fastening dimensions, of electronic components to be mounted.

In a schematic and perspective lateral view, FIG. 2 shows an angle bracket 30 for mounting, which can be matched to various fastening dimensions of electronic components to be mounted.

Electronic components to be mounted, having housings with screw holes at a distance from each other that is less than the distance B (represented in FIG. 1) of the second groove 22 from the first groove 20, or less than the distance of the still further groove 24 from the first groove 20, can be clampingly fixed in place at least on one side by the angle bracket 30 by at least one screw (not represented) engaging the screw nut introduced into the appropriate groove 22.

The angle bracket 30 has a level base plate 34 for placement against the mounting plate 10 and a clamping area 36, angled off it and made in one piece, for the clamping fixation in place of the electronic component to be mounted.

The angle bracket 30 has two elongated holes 38 and 39 extending perpendicularly (arrow D) to the extension direction (arrow A) of the second groove 22 or the still further groove 24 for receiving a screw (not represented).

Figure 3:
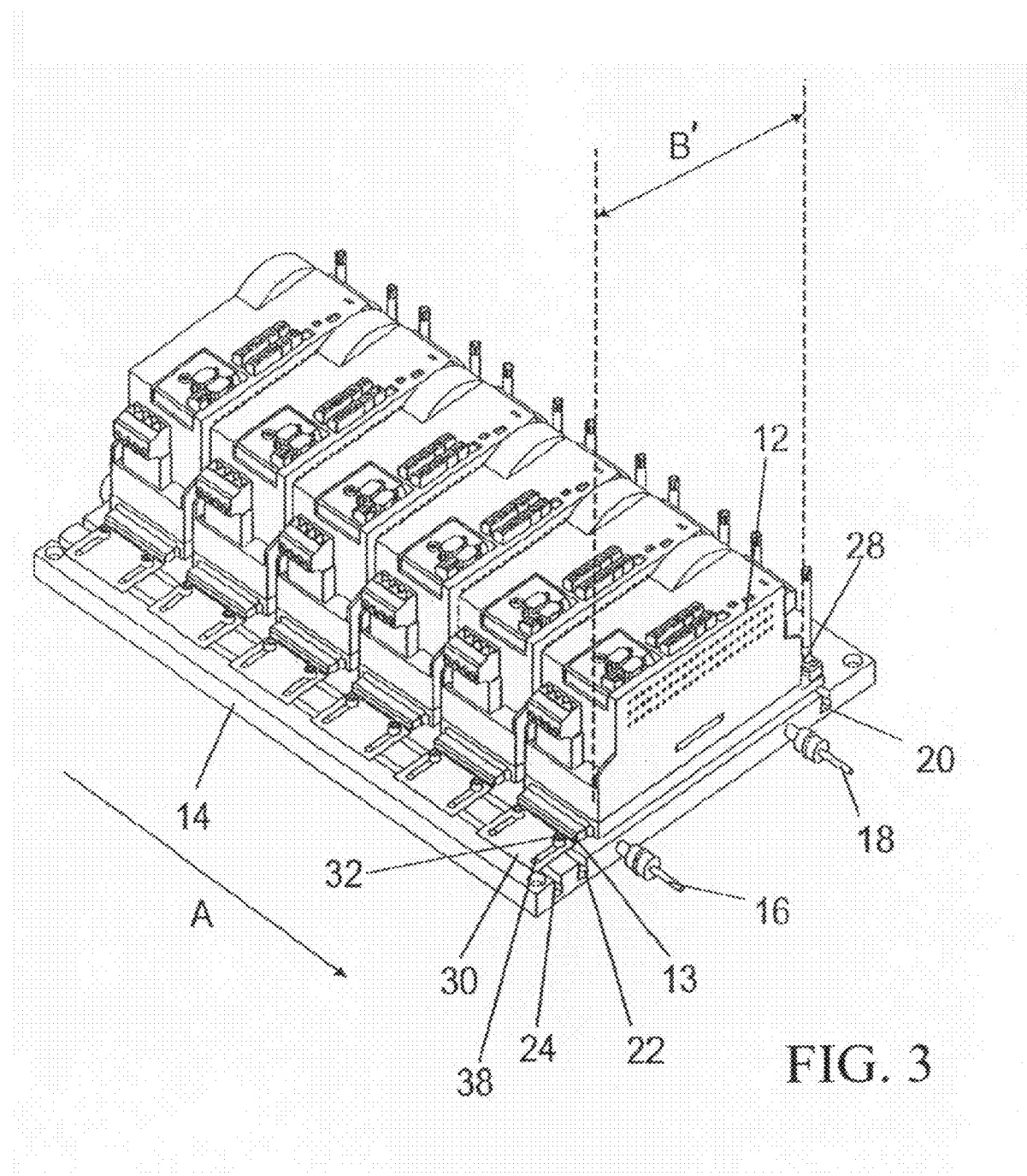
FIG. 3 shows in a schematic and perspective lateral view the mounting plate in accordance with FIG. 1 with electronic components to be mounted on it and to be cooled, each of which is clampingly held on one side by an angle bracket, in accordance with FIG. 2.

In a schematic and perspective lateral view, FIG. 3 shows the mounting plate 10 in accordance with FIG. 1 with frequency converters 12 to be mounted on it and to be cooled, each of which is clampingly held on one side by an angle bracket 30 in accordance with FIG. 2.

The frequency converters, whose extension B' does not match the spacing between the two grooves 20 and 22, are each screwed together on the side on the right in FIG. 3 with screws engaging the spring nuts (not represented) introduced into the groove 20. Such a screw is provided with the reference numeral 28 in FIG. 3.

On the left side in FIG. 3, the frequency converters 12 are each clamped to an additional angle bracket, one of which has the reference numeral 30. For example, a screw 32 in the elongated hole 38 of the angle bracket 30 represented, engages a spring nut (not represented) introduced into the second groove 22. The angle bracket 30 clampingly engages a protrusion 13 on the housing of the frequency converter 12. The fastening dimension which does not match the groove distances is compensated by the elongated hole.

The Invention claimed is:

1. A mounting plate (10) for electronic components (12) and having coolant lines (16, 18) integrated in a plate body (14) for a cooling fluid to flow through, the plate body (14) including a fastening arrangement for mounting the electronic components to be cooled, comprising:
   a first groove (20) having a C-shaped cross section and extending in a straight line in an extension direction (A) of the mounting plate (10);
   a second groove (22) identical to the first groove (20) and extending parallel with the first groove (20) at a distance (B) from the first groove (20), the distance (B) matching a length of an extension between screw holes of a first electronic component (12) mountable on the mounting plate (10), wherein the first electronic component (12) is mountable to the plate body (14) by a screw connection with at least one screw nut inserted and fixed against relative rotation in each of the first groove (20) and the second groove (22); and
   an angle bracket (30) for mounting to the plate body (14) a second electronic component having a second length of extension, perpendicularly with respect to the first and second grooves (20, 22), that is less than the distance (B), the angle bracket (30) including a level base plate (34), a clamping area (36) offset from the level base plate (34), and an elongated hole (38) in the level base plate (34) for receiving a screw (32) and elongated in a direction perpendicular to the extension direction (A);
   wherein a first end of the second electronic component is mountable to the plate body (14) by a screw connection with at least one screw nut inserted and fixed against relative rotation in one of the first groove (20) or the second groove (22), and the level base plate (34) is placed against the plate body (14) and a second end of the second electronic component is clampingly mounted to the plate body (14) by passing the clamping area (36) over a portion of the second end of the second electronic component and tightening the screw (32) passing through the elongated hole (38) and coupled with a screw nut positioned within an other of the first groove (20) or the second groove (22).

2. The mounting plate in accordance with claim 1, wherein the fastening arrangement has at least one further groove (24) identical to the first groove (20) and the second groove (22) and extending parallel with the second groove (22) and which extends at the side (26) of the second groove (22) facing away from the electronic component to be mounted at a second distance (C) from the electronic component which is less than the distance (B) between the first groove (20) and the second groove (22).

3. The mounting plate in accordance with claim 1, wherein at least one of the screw nuts is a spring nut.

4. The mounting plate in accordance with claim 3, wherein at least one of the first groove (20), the second groove (22) and the still further groove (24) is made of one piece with the plate body.

5. The mounting plate in accordance with claim 1, wherein at least one of the first groove (20), the second groove (22) and the still further groove (24) is made of one piece with the plate body.

6. A mounting plate (10) for electronic components (12) and having coolant lines (16, 18) integrated in a plate body (14), for a cooling fluid to flow through, and a fastening arrangement for mounting the electronic components (12) to be cooled, the mounting plate comprising:

the plate body (14) comprising a first groove (20) having a C-shaped cross section and extending in a straight line in an extension direction (A) of the mounting plate (10), into which at least one screw nut for forming a screw connection with the electronic component (12) can be inserted and fixed against relative rotation;

the plate body (14) comprising one second groove (22) extending parallel to the first groove (20) with a distance (B) from the first groove (20); and an angle bracket (30) for mounting to the plate body (14) an electronic component having a length (B') that is less than the distance (B) between the first groove (20) and the second groove (22), the angle bracket (30) including a level base plate (34), a clamping area (36) offset from the level base plate (34), an elongated hole (38) in the level base plate (34) and a screw (32) passing through the elongated hole (38) and coupled with a screw nut positioned within one of the first groove (20) or the second groove (22), wherein the level base plate (34) is placed against the plate body (14) and a protrusion of the electronic component (12) is clampingly mounted by passing the clamping area (36) over a portion of the protrusion of the electronic component (12) and tightening the screw (32) with respect to the screw nut.

7. The mounting plate in accordance with claim 6, wherein at least one of the screw nuts is a spring nut.

8. The mounting plate in accordance with claim 6, wherein the fastening arrangement has at least one further groove (24) identical to the first groove (20) and the second groove (22) and extending parallel with the second groove (22) and which extends at the side (26) of the second groove (22) facing away from the electronic component to be mounted at a second distance (C) from the electronic component which is less than the distance (B) between the first groove (20) and the second groove (22).

* * * * *